(12) United States Patent
Dall'Acqua

(10) Patent No.: US 12,144,129 B2
(45) Date of Patent: Nov. 12, 2024

(54) STEERING COMPUTER COMPRISING A BONDED CONNECTION BOX

(71) Applicant: JTEKT EUROPE, Irigny (FR)

(72) Inventor: Clément Dall'Acqua, Caluire et Cuire (FR)

(73) Assignee: JTEKT EUROPE, Irigny (FR)

( * ) Notice: Subject to any disclaimer, the term of this patent is extended or adjusted under 35 U.S.C. 154(b) by 363 days.

(21) Appl. No.: 17/577,870

(22) Filed: Jan. 18, 2022

(65) Prior Publication Data

US 2022/0232713 A1 Jul. 21, 2022

(30) Foreign Application Priority Data

Jan. 20, 2021 (FR) ..................... 21/00524

(51) Int. Cl.
| | | |
|---|---|---|
| H01R 13/00 | (2006.01) |
| H05K 5/00 | (2006.01) |
| H05K 5/06 | (2006.01) |
| H05K 5/04 | (2006.01) |

(52) U.S. Cl.
CPC ........... *H05K 5/0069* (2013.01); *H05K 5/064* (2013.01); *H05K 5/04* (2013.01)

(58) Field of Classification Search
CPC ........ H05K 5/0069; H05K 5/064; H05K 5/04; H01R 13/5216; H01R 43/005; B62D 5/0406; B62D 5/0403
See application file for complete search history.

(56) References Cited

U.S. PATENT DOCUMENTS

| | | | | |
|---|---|---|---|---|
| 5,324,203 A * | 6/1994 | Sano | ...................... | B60K 35/60 |
| | | | | 174/72 A |
| 2013/0066514 A1 * | 3/2013 | Das | ...................... | G07C 5/008 |
| | | | | 701/31.5 |
| 2013/0099611 A1 * | 4/2013 | Suga | ...................... | H02K 5/225 |
| | | | | 310/71 |
| 2018/0208234 A1 * | 7/2018 | Rey | ...................... | B62D 5/0403 |
| 2019/0103787 A1 * | 4/2019 | Maeshima | ........... | B62D 5/0406 |
| 2019/0150269 A1 * | 5/2019 | Klenk | .................. | B62D 5/0403 |
| | | | | 310/68 R |
| 2019/0312491 A1 * | 10/2019 | Yamamoto | ......... | H02K 11/0094 |
| 2020/0052448 A1 * | 2/2020 | Brochot | ................ | H01R 43/20 |
| 2020/0377143 A1 * | 12/2020 | Miyachi | .................. | H02M 1/32 |

FOREIGN PATENT DOCUMENTS

| | | |
|---|---|---|
| EP | 2634868 A1 | 9/2013 |
| FR | 2854604 A1 | 11/2004 |
| FR | 3065588 A1 | 10/2018 |

OTHER PUBLICATIONS

Jan. 20, 2021 Written Opinion issued in French Patent Application No. 2100524.

* cited by examiner

*Primary Examiner* — Abdullah A Riyami
*Assistant Examiner* — Nelson R. Burgos-Guntin
(74) *Attorney, Agent, or Firm* — Oliff PLC

(57) ABSTRACT

A steering computer for a vehicle includes: at least one printed circuit positioned inside a computer casing, the computer casing including on an external surface at least one joining contact, at least one connection box provided with at least one connector, the at least one connector being connected to at least one joining contact, characterized in that the at least one connection box is fixed to the computer casing by means of at least one fixing element, said at least one fixing element being at least partially embedded in a resin.

10 Claims, 3 Drawing Sheets

STEERING COMPUTER COMPRISING A BONDED CONNECTION BOX

The invention concerns the field of power steering systems for a vehicle, and more particularly a steering computer and a vehicle comprising such a steering computer.

The object of a vehicle steering system is to allow a driver to control a trajectory of the vehicle by exerting a force on a steering wheel.

Generally, a steering system comprises several elements including said steering wheel connected to a steering column, a rack, and two wheels each connected to a connecting rod. The rack is the part making it possible to connect the steering wheel, via the steering column, to the wheels, via the connecting rods; that is to say that the rack transforms the forces exerted by the driver on the steering wheel into a rotation of the vehicle wheels.

An electric power steering system of a vehicle uses an assist motor, driven by a steering computer, to reduce the forces to be made by the driver on the steering wheel to turn the vehicle wheels.

More precisely, the steering computer comprises a printed circuit, also called an electronic card, which is positioned in a sealed case called a computer casing. The latter ensures that the printed circuit is maintained in a clean environment in order to guarantee its reliability during the operation of the vehicle. A clean environment is defined as a medium in which humidity level and dust level are controlled. Conversely, a dirty environment is therefore defined as a medium in which the humidity level and the dust level vary without control.

The steering computer also comprises a bundle of electrical wires which allow, on the one hand, to supply power to the steering computer, and on the other hand, communicate with other parts of the vehicle. The electric wires are electric cables insulated by an insulating sheath. The electric wires are connected to the printed circuit via in particular a connection box. More precisely, the electric wires are connected to connectors which in turn are connected to joining contacts of the computer casing. The connection box thus provides a sealed interface between the printed circuit which must remain in a clean environment and the bundle of electric wires positioned in the vehicle, in other words in a dirty environment.

There is known a steering computer 1', as represented in FIG. 1, comprising a connection box 2' which is fixed to a cowl 3' of a computer casing 4' by means of screws 5'. For this, the cowl 3' comprises studs 31' in which a screw is inserted.

The steering computer 1' also comprises a bundle 6' of electric wires 61' and a protection cowl 7' for the electric wires 61' which is also fixed to the cowl 3' of the computer casing 4' by means of screws 5' in the same way as the connection box 2'.

More specifically, the electric wires 61' are connected to connectors 21' of the connection box 2' by soldering. The connectors 21' in turn are connected to joining contacts 41' of the computer casing 4'.

In order to ensure a seal of the connection box 2', it is filled with a resin 8'.

Generally, a manufacturing of the steering computer is carried out as follows: the printed circuit is mounted in the computer casing in a first place having a clean environment called a «clean room». The computer casing is closed in this first place. Thus, on leaving the first place, the computer casing is sealed (the printed circuit is therefore protected) and has joining contacts on an external surface. The computer casing is brought close to the vehicle where it will be fixed, or to another factory not considered as a «clean room». Then, the connectors of the connection box are soldered to the joining contacts and the connection box is fixed by means of screws on the cowl. The electric wire bundle is soldered to the connectors. Finally, a resin is poured into the connection box to seal the connection box.

The object of the invention is to provide a steering computer having a volume, an assembly speed, and a manufacturing cost which is lower than that of the state of the art.

The object of the invention is to remedy all or part of the aforementioned drawbacks by providing a steering computer for a vehicle comprising:

at least one printed circuit positioned inside a computer casing, the computer casing comprising on an external surface at least one joining contact, at least one connection box provided with at least one connector, at least one connector being connected to at least one joining contact, characterized in that at least one connection box is fixed to the computer casing by means of at least one fixing element, said at least one fixing element being at least partly embedded in a resin.

The at least one joining contact is connected to the at least one printed circuit.

The resin forms a bond between the fixing element fixed to the computer casing, and more precisely to the external surface of the computer casing, and the connection box. The connection box is therefore held on the computer casing by gluing. The resin bears on the fixing element and on a wall of the connection box. Thus, the steering computer according to the invention has a smaller bulk than that of the state of the art because it does not require studs in which screws are inserted.

The used resin also makes it possible to seal the connection box.

The steering computer according to the invention does not require more resin than a computer of a state of the art.

Furthermore, the computer according to the invention has, on the one hand, an economic gain because it does not require additional fastening parts such as screws, and on the other hand a saving in manufacturing time in that the fixing of the connection box is directly produced by the resin without prior screwing step.

According to one characteristic of the invention, the fixing element is a fixing elongation.

According to one characteristic of the invention, the at least one connection box comprises an orifice through which at least one fixing element is inserted into the connection box.

According to one characteristic of the invention, a cowl of the computer casing is made of plastic.

According to one characteristic of the invention, the cowl of the computer casing comprises at least one fixing element fixed in a non-detachable manner.

According to a feature of the invention, the resin creates a «cohesively failing» adhesion between the at least one fixing element and the at least one connection box.

A «cohesively failing» adhesion means that if the connection box is pulled from the computer casing, the fracture will occur inside the resin or the fixing element or the connection box. The cohesive failure indicates that the «fixing element/resin or connection box/resin» interface behaved stronger than the materials themselves.

Thus, the connection box is perfectly fixed to the computer casing.

According to one characteristic of the invention, at least one fixing element is made of plastic.

Thus, it is easy to find a resin allowing plastic to be bonded.

According to one characteristic of the invention, the computer casing is made of metal and comprises at least one plastic base, the base comprising at least one fixing element.

Thus, the computer casing has good mechanical strength and effectively protects the printed circuit while the base comprising the fixing element ensures good cohesion with the resin.

According to one characteristic of the invention, the fixing element is fixed to the base.

According to one characteristic of the invention, the fixing element is integral with the base.

According to one characteristic of the invention, the base comprises at least one joining contact.

Since the base is made of plastic, the seal between the base and the joining contact is facilitated.

According to one characteristic of the invention, the at least one fixing element has a rectilinear shape.

According to one characteristic of the invention, the at least one connection box is made of plastic.

Thus, it is easy to find a resin allowing plastic to be bonded.

According to one characteristic of the invention, the resin completely fills the at least one connection box.

Thus, the resin also seals the connection box.

According to one characteristic of the invention, the resin is thermosetting.

Thus, the resin is poured into the connection box. The resin can then perfectly bind the fixing element to the connection box.

According to one characteristic of the invention, the steering computer also comprises at least one protection cowl fixed to at least one connection box by means of at least one fixing lug at least partly embedded in the resin.

The protection cowl is intended to protect electrical wires or to participate in the retention of the resin by constituting a part of the connection box.

According to the invention, the protection cowl is not directly attached to the external surface of the computer casing but via the connection box.

The fixing lug is at least partially embedded in the resin also making it possible to fix the connection box. On the protection cowl, the fixing lug is integral with the cowl or is fixed to the latter by screwing, welding, gluing or any other known means.

According to one characteristic of the invention, the at least one fixing lug has a shape having at least one angle.

According to one characteristic of the invention, the angle is greater than 10°, or 30°, or 90°.

The invention also relates to a vehicle comprising a steering computer according to the invention.

The invention will be better understood, thanks to the description below, which relates to an embodiment according to the present invention, given by way of non-limiting example and explained with reference to the accompanying schematic drawings, in which.

Figure 1:
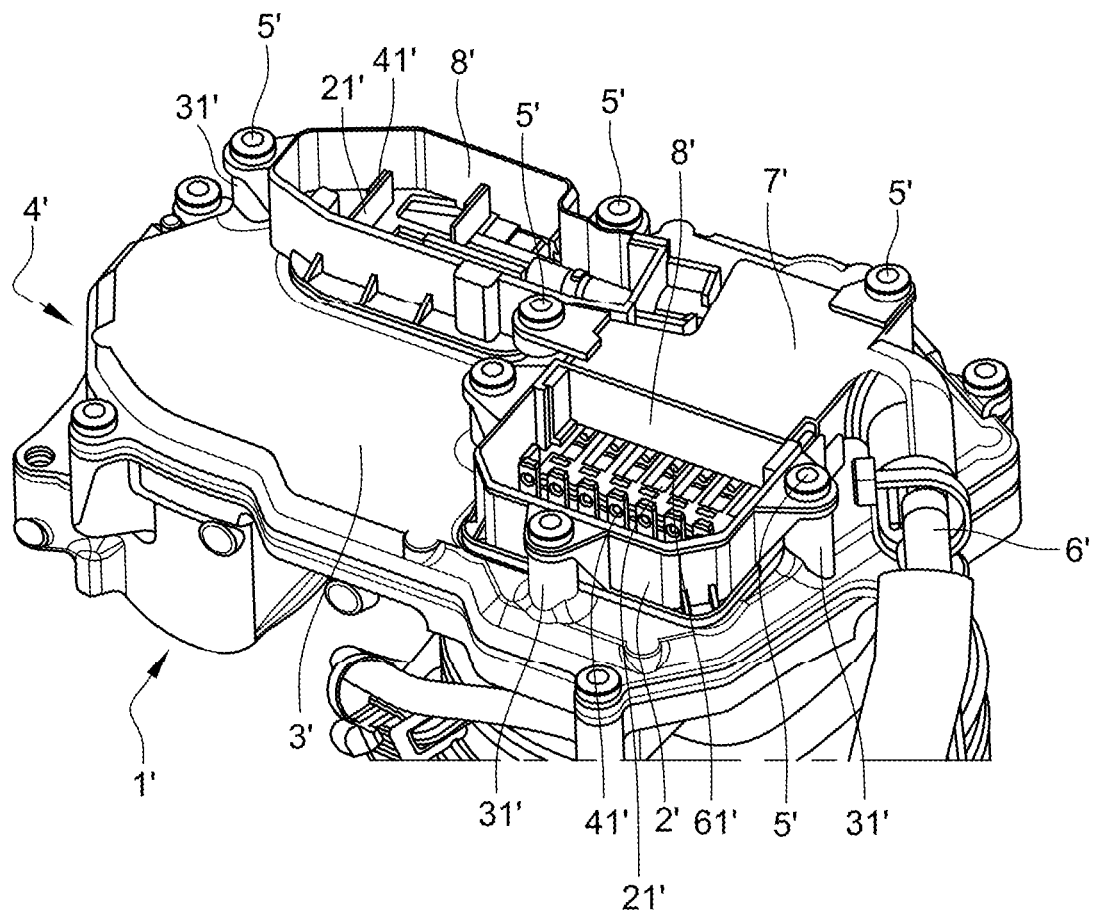
FIG. 1 is a three-dimensional representation of a steering computer according to the state of the art.
Figure 2:
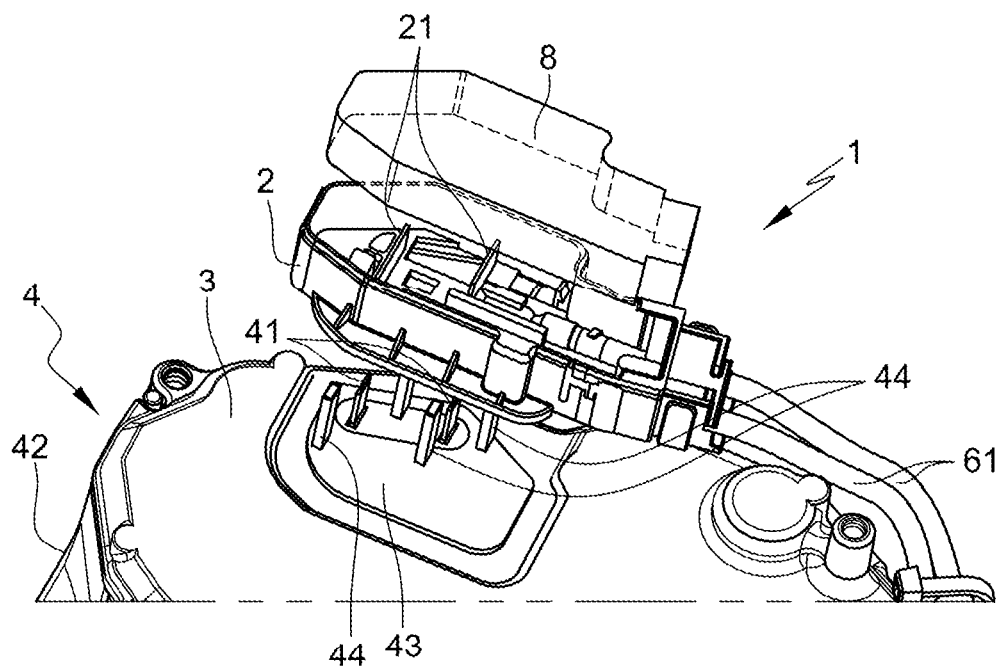
FIG. 2 is an exploded view of a steering computer according to the invention during the assembly.
Figure 3:
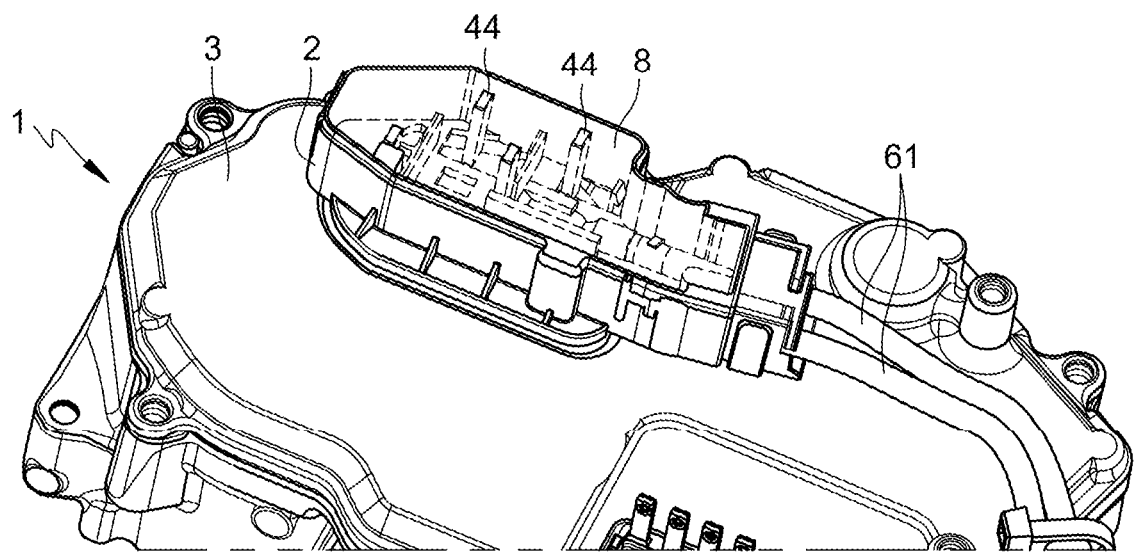
FIG. 3 is a three-dimensional representation of the steering computer according to the invention during the assembly.
Figure 4:
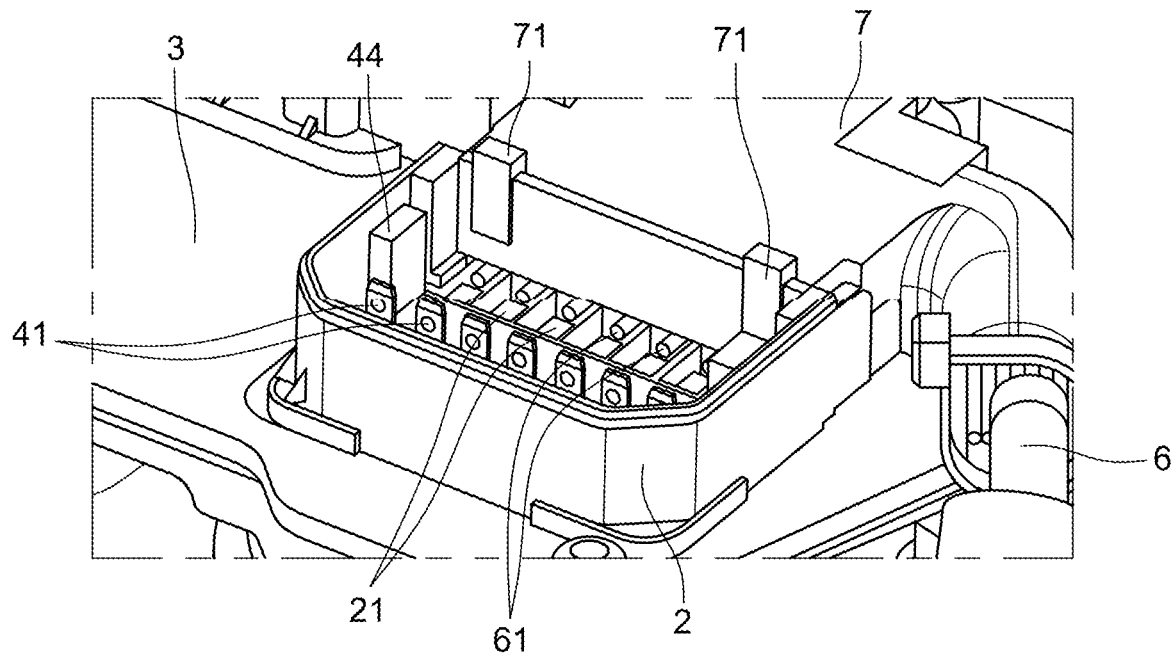
FIG. 4 is a view on a larger scale of the steering computer according to the invention.
Figure 5:
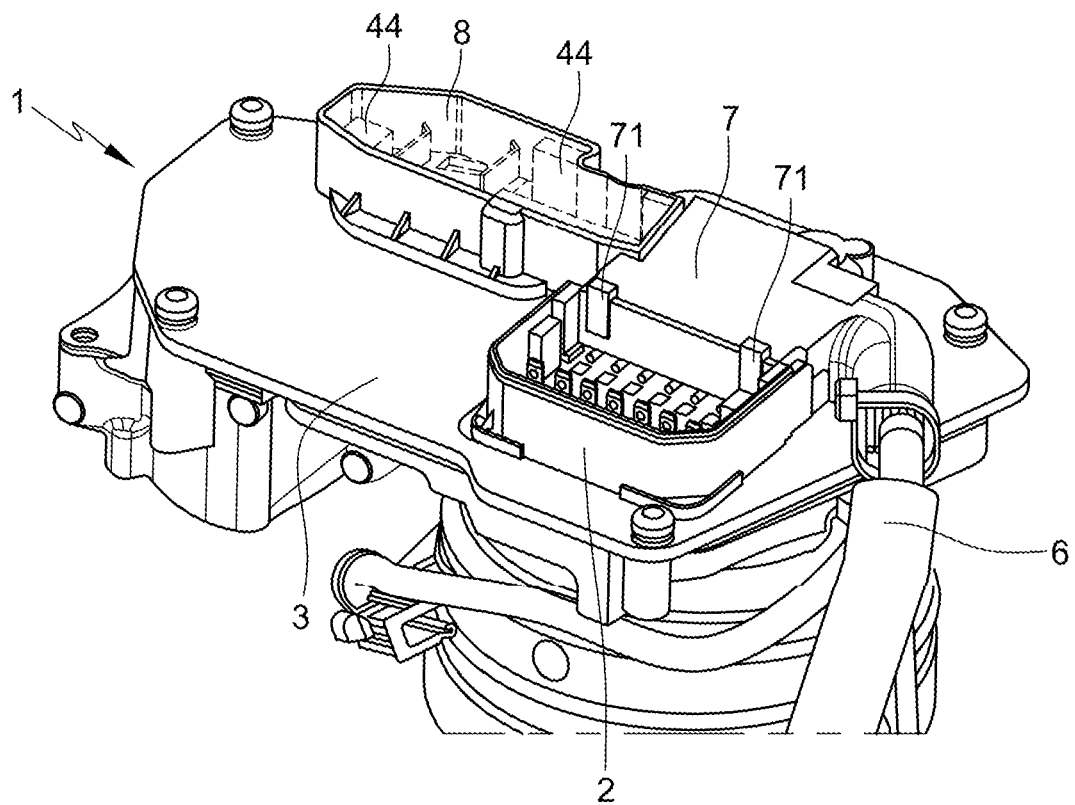
FIG. 5 is a three-dimensional view of the steering computer according to the invention.

FIGS. 2 to 5 represent a steering computer 1 according to the invention. The steering computer 1 comprises a printed circuit positioned inside a computer casing 4. The computer casing 4 is made of a metal such as aluminum. The computer casing 4 comprises on an external surface 42, corresponding to a cowl 3, bases 43 made of plastic. The bases 43 are sealed to the computer casing 4. The bases 43 comprise joining contacts 41. The joining contacts 41 ensure an electrical connection to the printed circuit. The bases 43 also comprise fixing elements 44 made of the same material as the base 43, that is to say plastic. The fixing elements 44 are integral with the bases 43.

The steering computer 1 also comprises connection boxes 2 provided with connectors 21. The connection boxes 2 are made of plastic.

The steering computer 1 also comprises a bundle 6 of electric wires 61. The electric wires 61 are electrically connected to the connectors 21 and the connectors 21 are electrically connected to the joining contacts 41.

The connection boxes 2 are fixed to the computer casing 4 by means of the fixing elements 44 which are inserted into the connection boxes 2 and embedded in a thermosetting resin 8. The resin 8 creates a «cohesively failing» adhesion between the fixing elements 44 and the connection boxes 2. The resin 8 is poured into the connection box 2 so that it fills it completely.

Furthermore, the steering computer 1 comprises a protection cowl 7 intended to protect the electric wires 61. The protection cowl 7 extends substantially parallel to the cowl 3 of the computer casing 4. The protection cowl 7 is fixed to the connection boxes 2 by means of fixing lugs 71 which are embedded in the resin 8. The fixing lugs 71 have angles of 90°.

A manufacturing of the steering computer 1 is made as follows: the printed circuit is mounted in the computer casing 4 in a first place having a clean environment. The computer casing 4 is closed by a cowl 3 in this first place. Thus, on leaving the first place, the computer casing 4 is sealed and has the joining contacts 41 on the external surface 42. The computer casing 4 is brought close to the vehicle where it will be fixed. Then, the connectors 21 of the connection boxes 2 are soldered to the joining contacts 41. The bundle 6 of electric wires 61 is soldered onto the connectors 21. Finally, the resin 8 is poured into the connection boxes 2 in order to achieve the sealing of the connection box 2.

Of course, the invention is not limited to the embodiment described and represented in the accompanying figures. Modifications remain possible, in particular from the point of view of the constitution of the various elements or by substitution of technical equivalents, without departing from the scope of protection of the invention.

The invention claimed is:

1. A steering computer for a vehicle comprising:
   at least one printed circuit positioned inside a computer casing, the computer casing comprising on an external surface at least one joining contact,
   at least one connection box provided with at least one connector, the at least one connector being connected to at least one joining contact,
   wherein the at least one connection box is fixed to the computer casing by means of at least one fixing element, said at least one fixing element being at least partially embedded in a resin and the at least one fixing element being a protrusion that protrudes from an outer surface of the computer casing and into the at least one connection box.

2. The steering computer according to claim 1, wherein the resin creates a «cohesively failing» adhesion between the at least one fixing element and the at least one connection box.

3. The steering computer according to claim 1, wherein at least one fixing element is made of plastic.

4. The steering computer according to claim 3, wherein the computer casing is made of metal and comprises at least one base made of plastic, the base comprising at least one fixing element.

5. The steering computer according to claim 1, wherein at least one connection box is made of plastic.

6. The steering computer according to claim 1, wherein the resin completely fills the at least one connection box.

7. The steering computer according to claim 1, wherein the resin is thermosetting.

8. The steering computer according to claim 1, also comprising at least one protection cowl fixed to the at least one connection box by means of at least one fixing lug at least partially embedded in the resin.

9. The steering computer according to claim 8, wherein the at least one fixing lug has a shape having at least one angle.

10. A vehicle comprising a steering computer according to claim 1.

\* \* \* \* \*